(12) United States Patent
Escalante et al.

(10) Patent No.: US 12,410,640 B2
(45) Date of Patent: Sep. 9, 2025

(54) INDUCTIVE SENSOR FOR VEHICLE

(71) Applicant: VITESCO TECHNOLOGIES GMBH, Hannover (DE)

(72) Inventors: Yannis Escalante, Toulouse (FR); Vincent Marimoutou, Toulouse (FR); Julien Galaup, Toulouse (FR)

(73) Assignee: VITESCO TECHNOLOGIES GMBH, Hanover (DE)

( * ) Notice: Subject to any disclaimer, the term of this patent is extended or adjusted under 35 U.S.C. 154(b) by 619 days.

(21) Appl. No.: 17/614,258

(22) PCT Filed: May 26, 2020

(86) PCT No.: PCT/EP2020/064556
§ 371 (c)(1),
(2) Date: Nov. 24, 2021

(87) PCT Pub. No.: WO2020/239756
PCT Pub. Date: Dec. 3, 2020

(65) Prior Publication Data
US 2022/0243504 A1    Aug. 4, 2022

(30) Foreign Application Priority Data

May 28, 2019   (FR) ...................................... 1905647

(51) Int. Cl.
*E05B 81/78*   (2014.01)
*E05B 81/76*   (2014.01)
*H03K 17/97*   (2006.01)

(52) U.S. Cl.
CPC .............. *E05B 81/78* (2013.01); *E05B 81/77* (2013.01); *H03K 17/97* (2013.01); *H03K 2017/9706* (2013.01); *H03K 2217/96038* (2013.01)

(58) Field of Classification Search
CPC .......... E05B 81/76; E05B 81/77; E05B 81/78; H03K 17/97; H03K 2017/9706; H03K 2217/96038
See application file for complete search history.

(56) References Cited

U.S. PATENT DOCUMENTS 9,640,006 B2   5/2017   Guibbert et al.
9,995,065 B2   6/2018   Witte et al.
(Continued)

FOREIGN PATENT DOCUMENTS

EP   0099278   1/1984
EP   3054069   8/2016
(Continued)

OTHER PUBLICATIONS

Office Action issued in Chinese Patent Application No. 202080039313.1 dated Apr. 26, 2022.
(Continued)

*Primary Examiner* — Christine M Mills
*Assistant Examiner* — Yahya Sidky
(74) *Attorney, Agent, or Firm* — NIXON & VANDERHYE, PC

(57) ABSTRACT

Disclosed is an inductive detection sensor for unlocking a vehicle opening, the sensor particularly being able to be mounted in the opening and including a printed circuit, on which an inductive coil and a management module are mounted, which module is able to detect a variation in the electromagnetic field at the terminals of the inductive coil, the sensor including a visible pressure component, which is at least partially metal, at least partially arranged in line with the inductive coil and being able to move relative to the inductive coil after a pressure is directly exerted onto the pressure component by a user, the management module being able to control the unlocking of the opening following (Continued)

the detection of a variation in the electromagnetic field at the terminals of the inductive coil following a movement of the visible pressure component by a user.

21 Claims, 4 Drawing Sheets

(56) References Cited

U.S. PATENT DOCUMENTS

| | | | |
|---|---|---|---|
| 10,428,562 B2 * | 10/2019 | Guibbert | H03K 17/97 |
| 10,647,290 B2 | 5/2020 | Spick et al. | |
| 10,879,897 B2 | 12/2020 | Spick et al. | |
| 10,975,601 B2 | 4/2021 | Beck et al. | |
| 11,078,692 B2 | 8/2021 | Spick et al. | |
| 2004/0046449 A1 * | 3/2004 | Eidesheim | E05B 81/78 |
| | | | 307/10.1 |
| 2016/0230429 A1 * | 8/2016 | Witte | E05B 81/76 |
| 2017/0235008 A1 * | 8/2017 | Guibbert | H03K 17/955 |
| | | | 324/679 |
| 2019/0169893 A1 | 6/2019 | Scheiern et al. | |
| 2020/0011096 A1 * | 1/2020 | Leonardi | E05B 81/78 |

FOREIGN PATENT DOCUMENTS

| | | |
|---|---|---|
| FR | 3025824 | 3/2016 |
| FR | 3038642 | 1/2017 |
| FR | 3063097 | 8/2018 |
| FR | 3065418 | 10/2018 |
| WO | 2017/009073 | 1/2017 |
| WO | 2018/150106 | 8/2018 |

OTHER PUBLICATIONS

International Search Report for PCT/EP2020/064556 mailed Jul. 31, 2020, 6 pages.
Written Opinion of the ISA for PCT/EP2020/064556 mailed Jul. 31, 2020, 6 pages.

* cited by examiner

INDUCTIVE SENSOR FOR VEHICLE

This application is the U.S. national phase of International Application No. PCT/EP2020/064556 filed May 26, 2020 which designated the U.S. and claims priority to FR Patent Application No. 1905647 filed May 28, 2019, the entire contents of each of which are hereby incorporated by reference.

BACKGROUND OF THE INVENTION

Field of the Invention

The present invention relates to detection sensors, and more specifically to an inductive detection sensor for a motor vehicle, as well as to a vehicle comprising such a sensor.

Description of the Related Art

At present, it is known for sensors to be mounted in the door handles of a motor vehicle in order to detect a user wishing to unlock the openings. These sensors particularly can be of the capacitive type or of the inductive type.

Capacitive sensors are used to detect the presence of the human body, for example, the hand of a user, by detecting the variations in the electromagnetic field between an electrode of the sensor and the human body, which varies the capacitance of the sensor when it is approached. Inductive sensors are particularly used for unlocking operations using a push-button. These sensors detect the variations in the electromagnetic field generated by a movement of a metal target, connected to the push-button, relative to an inductive coil when the push button is pressed by a user in order to unlock the door.

In a known solution for an inductive sensor for a door handle, the sensor comprises a printed circuit, a metal target, assuming the form of a metal plate, and a deformable target support. The metal target is mounted in the deformable target support, which is fixed to the rear part of a push-button of the handle, facing the inductive coil. The printed circuit comprises an inductive coil and a microcontroller, which detects the voltage variations at the terminals of the inductive coil. When a user presses the push-button in order to unlock the door, they move the target by deforming the support so as to reduce the distance between the target and the inductive coil. This modification of the distance varies the electromagnetic field and therefore the voltage at the terminals of the coil, so that the microcontroller detects this variation and then controls the unlocking of the opening.

Such a sensor nevertheless has disadvantages. Indeed, when assembling the sensor in the vehicle, the target needs to be fixed on the rear part of the push-button, which can be complex and time-consuming. Furthermore, manufacturing and assembling the target support and the target in the support can prove to be complex and time-consuming. Finally, the use of a target and a support make the sensor particularly expensive; however, in the motor vehicle industry, reducing the cost of each component and item of equipment is desirable.

It is therefore advantageous to propose a simple, reliable, effective and inexpensive inductive sensor solution for a motor vehicle in order to at least partially overcome these disadvantages.

SUMMARY OF THE INVENTION

To this end, the subject matter of the invention is first of all an inductive detection sensor for unlocking a vehicle opening, in particular a motor vehicle, said sensor particularly being able to be mounted in said opening and comprising a printed circuit, on which an inductive coil and a management module are mounted, which module is able to detect a variation in the electromagnetic field at the terminals of said inductive coil, said sensor being characterized in that it comprises a visible pressure component, which is at least partially metal, at least partially arranged in line with said inductive coil and is able to move relative to the inductive coil after a pressure is directly exerted onto said pressure component by a user, the management module being able to control the unlocking of the opening following the detection of a variation in the electromagnetic field at the terminals of the inductive coil following a movement of the visible pressure component by a user.

The term "visible" is understood to mean that when the sensor is mounted in the opening the pressure component has an outer surface that is visible from outside the vehicle and has a portion that can be pressed by a user in order to move said pressure component. The sensor according to the invention advantageously uses a visible element of the vehicle, for example, a push-button, or directly a handle, to detect an unlocking request from a user. The sensor according to the invention therefore dispenses with the use of a metal target and a target support by using a component of the vehicle that already exists. Therefore, the invention advantageously allows the cost and the complexity of manufacturing and assembling the sensor to be limited.

In a first embodiment, with the opening being a door comprising a handle and said handle comprising a hollow body defining an internal housing, the printed circuit and the inductive coil are able to be mounted inside said internal housing and the pressure component is a visible element of the handle, outside the internal housing. The sensor thus can be mounted in the hollow body handles fitted to most current vehicles.

In a second embodiment, with the opening being a door comprising a handle mounted in a housing of the door and said housing being closed by a shell, the printed circuit and the coil are able to be mounted in a casing fixed on said shell at an opening formed in said shell and the pressure component is a visible element of the handle. The sensor thus can be mounted in handles of the type that are integrated in the door that at present are fitted to increasing numbers of vehicles.

In a third embodiment, with the opening being a door comprising a pillar, the printed circuit and the coil are able to be mounted in said pillar and the pressure component is an element of said pillar. The sensor thus can be mounted in any vehicle comprising a door pillar.

Advantageously, the visible pressure component is at least partially produced from a non-magnetic material, preferably made of chrome, which is a material that is currently in widespread use in vehicle openings. A non-magnetic material is advantageously used to reduce the level of magnetic interference with the other electronic equipment of the vehicle, with external electrical equipment or with any metal part located in the vicinity.

More advantageously, the visible pressure component comprises a logo or a strip in order to allow, for example, the user to quickly identify the zone to be pressed in order to activate the opening.

Preferably, the management module is implemented by a microcontroller.

In one embodiment, the sensor comprises a casing, in which the printed circuit is mounted, in order to easily mount the sensor in the vehicle.

In this case, the pressure component advantageously can be a wall of said casing, particularly in order to ensure that the pressure component is in line with the inductive coil.

The invention also relates to a vehicle, in particular a motor vehicle, comprising at least one sensor as previously described.

BRIEF DESCRIPTION OF THE DRAWINGS

Further features and advantages of the invention will become more clearly apparent from reading the following description. This description is purely illustrative and must be read with reference to the accompanying drawings, in which.

DESCRIPTION OF THE PREFERRED EMBODIMENTS

The inductive sensor according to the invention is a detection sensor intended to be mounted in a vehicle, in particular a motor vehicle, and more specifically in an opening of a vehicle in order to allow unlocking. It will be noted that the sensor nevertheless can be mounted in an element of the vehicle other than an opening, for example, in a wing, the roof or at any other suitable point of the vehicle, without this limiting the scope of the present invention. In the examples provided hereafter, the sensor is either mounted in a door handle, or in a door pillar.

Figure 1:
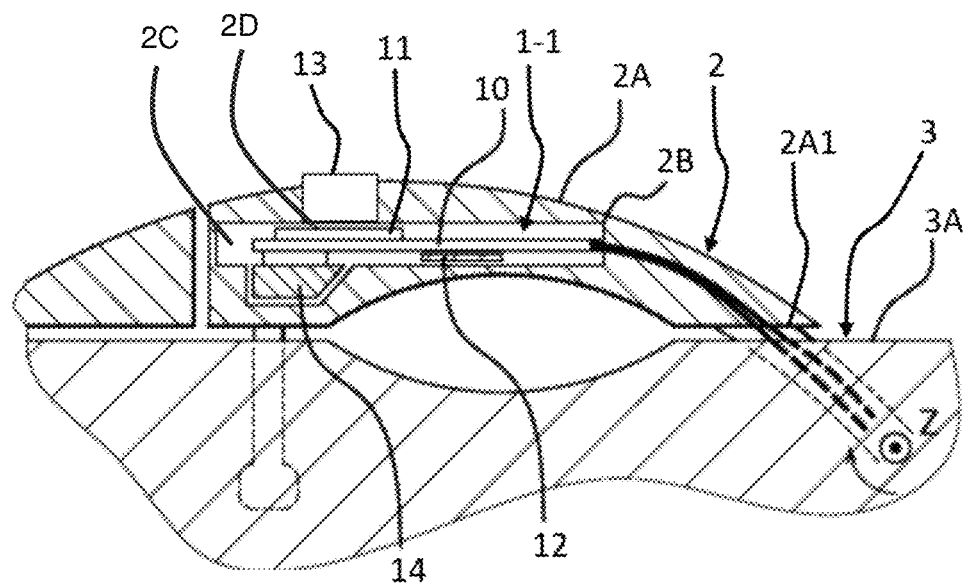
FIG. 1 schematically illustrates a first embodiment of the sensor according to the invention.

FIG. 1 shows a first embodiment of the sensor 1-1 according to the invention. In this first embodiment, the sensor 1-1 is mounted in a handle 2 of a door 3 of a vehicle. More specifically, the handle 2 comprises a hollow body 2A extending between two ends, one 2A1 of which is fixed to the lateral panel 3A of the door 3 at a hinge Z. This hollow body 2A defines an internal housing 2B accommodating elements of the sensor 1-1 and having a hollow space 2C within the hollow body 2A.

The sensor 1-1 comprises a printed circuit 10, mounted in the housing 2B of the body 2A of the handle 2, on which an electrically connected inductive coil 11 and management module are mounted. The management module 12 is able to electrically power the inductive coil 11 and to detect a voltage variation at the terminals of the inductive coil 11 that is synonymous with variations in the electromagnetic field. The management module 12 can be in the form of a microcontroller, for example.

The sensor 1-1 comprises a visible pressure component 13, outside the internal housing 2B and the hollow space 2C within the body 2A of the handle 2, in this example assuming the form of a push-button mounted in the body 2A of the handle 2, so as to be accessible to a user from outside the vehicle. A gap 2D is defined within the hollow space 2C and between the pressure component 13 and the printed circuit 10. This pressure component 13 is movably mounted relative to the body 2A of the handle 2 in order to be able to be moved, for example, by several tens or hundreds of micrometers relative to the body 2A when it is pressed by a user. In another embodiment, the pressure component 13 can be in any other suitable form allowing movement, for example, a simple button.

The pressure component 13 is at least partially metal, i.e. it is either fully metal, or it comprises one or more metal parts allowing the electromagnetic field to be varied that can be detected by the inductive coil 11 when the pressure component 13 moves. In this example, the pressure component 13 is advantageously arranged at least partially in line with said inductive coil 11, so as to significantly vary the electromagnetic field perceived by the inductive coil 11, and therefore the voltage at the terminals of the inductive coil 11, when a pressure is exerted by a user on said pressure component 13. Thus, according to the invention, the sensor 1-1 does not include a dedicated target. A visible metal component included in the door, which can be an element of the door, itself forms the target of the sensor 1-1. The target of the sensor 1-1 therefore is not located in the housing 2B, which in the prior art would comprise all the elements of the sensor 1-1, i.e. also including a dedicated target. The sensor according to the invention is therefore less expensive than the sensor of the prior art.

The management module 12 is electrically connected to the inductive coil 11 in order to continuously receive the value of the voltage defined at the terminals of the inductive coil 11. The management module 12 is able to control the unlocking of the door 3 as soon as the value of the voltage defined at the terminals of the inductive coil 11 varies following a variation in the electromagnetic field received by the inductive coil 11, which itself follows a movement of the pressure component 13 by a user.

The sensor 1-1 further comprises, in this example, an interface module 14 connected to an electrical source of the vehicle and able to supply the inductive coil 11 and the management module 11 with electrical power.

Figure 2:
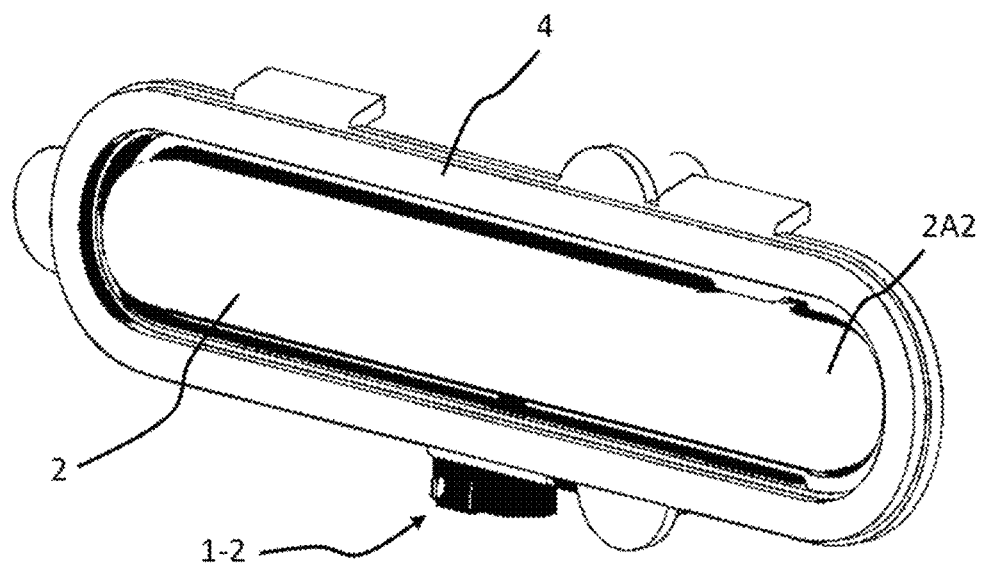
FIG. 2 schematically illustrates a door handle that can be integrated in a door of a motor vehicle.
Figure 3:
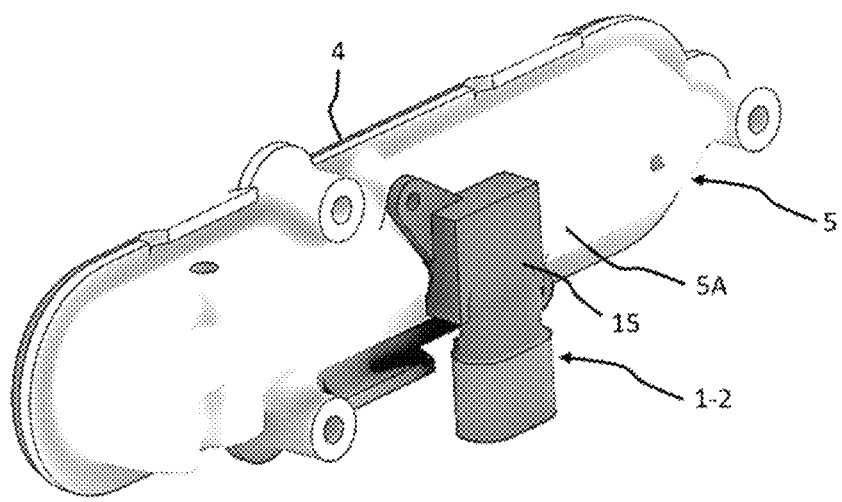
FIG. 3 schematically illustrates a second embodiment of the sensor according to the invention mounted behind the shell for accommodating the handle of FIG. 2.
Figure 4:
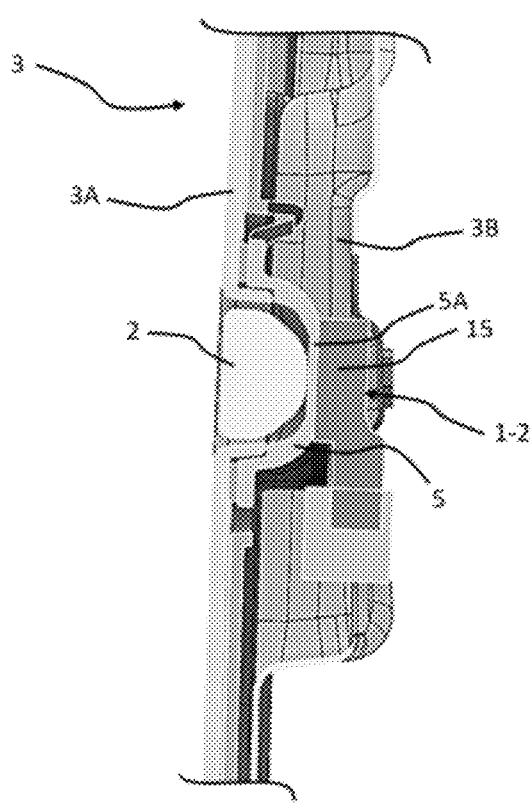
FIG. 4 is a longitudinal section view of the sensor of FIG. 3.

FIGS. 2 to 4 show a second embodiment of the sensor 1-2 according to the invention. In this second embodiment, the sensor 1-2 is connected to a handle 2 of a door 3 (FIG. 4). The handle 2 is substantially flat and retractable. More specifically, in a position called "folded" position, the handle 2 is accommodated in a housing 4 mounted in the door 3, so as to extend into the extension of the door 3. More specifically, the housing 4 is fixed on the internal wall of the lateral panel 3A of the door 3, between said lateral panel 3A and the internal lining 3B of the door 3. When a user wishes to unlock the door 3, they press on a zone located, in this example, at one end 2A2 of the handle 2 (FIG. 2), in order to deploy the handle outside the door 3, so that the user can grasp and pull the door 3. With reference to FIGS. 3 and 4, the rear of the housing 4 is closed by a shell 5 mounted in the door 3.

Still with reference to FIGS. 3 and 4, the sensor 1-2 comprises a casing 15 fixed on the rear part 5A of the shell 5, for example, using screws, in order to be moved in line with the handle 2, as illustrated on the section view of FIG. 4.

As in the first embodiment, the sensor 1-2 comprises, in the casing 15, a printed circuit, on which an electrically connected inductive coil and management module (not shown) are mounted. The management module is able to electrically power the inductive coil and to detect a voltage variation at the terminals of the inductive coil that is synonymous with variations in the electromagnetic field. The management module can be in the form of a microcontroller, for example.

The sensor 1-2 comprises a visible pressure component forming part of the flat handle 2, in order to be accessible to a user from outside the vehicle. In this example, the pressure component corresponds to the handle 2, which is movably mounted relative to the inductive coil when it is activated by a user.

In order to be able to vary the electromagnetic field perceived by the inductive coil, the handle 2 is at least partially metal, i.e. it is either fully metal or it comprises one or more metal parts allowing the electromagnetic field perceived by the inductive coil to be varied when the handle is pulled by a user.

Preferably, the inductive coil of the sensor 1-2 is arranged in line with the handle 2, so as to significantly vary the electromagnetic field and therefore the voltage at the terminals of the inductive coil of the sensor 1-2 when the handle 2 is moved by a user.

The management module is electrically connected to the inductive coil in order to be able to continuously receive the value of the voltage defined at the terminals of the inductive coil. The management module is able to control the unlocking of the door 3 as soon as the value of the voltage defined at the terminals of the inductive coil varies following a variation in the electromagnetic field received by the inductive coil itself following a movement of the handle 2 by a user.

The sensor 1-2 can also comprise an interface module connected to an electrical source of the vehicle and able to supply the inductive coil and the management module with electrical power.

Figure 5:
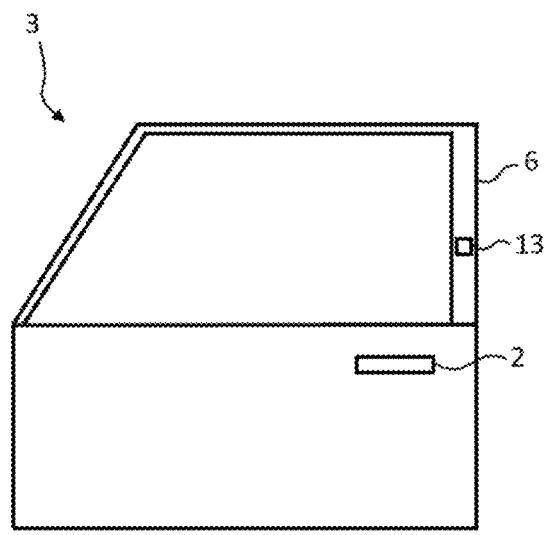
FIG. 5 schematically illustrates a door of a motor vehicle.
Figure 6:
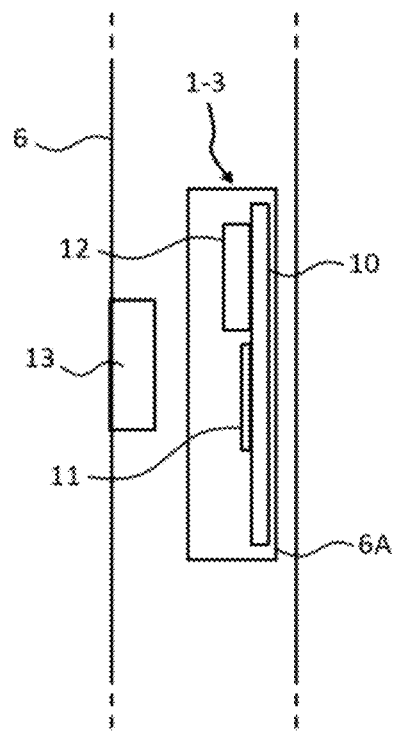
FIG. 6 schematically illustrates a third embodiment of the sensor according to the invention.

FIGS. 5 to 6 show a third embodiment of the sensor 1-3 according to the invention. In this third embodiment, with reference to FIG. 5, the sensor 1-3 is mounted in a central pillar 6 of the door 3.

With reference to FIG. 6, the pillar 6 comprises a housing 6A, in which the sensor 1-3 is mounted. The sensor 1-3 comprises a printed circuit 10, mounted in the housing 6A, and on which an electrically connected inductive coil 11 and management module 12 are mounted. The management module 12 is able to electrically power the inductive coil 11 and to detect a voltage variation at the terminals of the inductive coil 11 that is synonymous with variations in the electromagnetic field. The management module 12 can be in the form of a microcontroller, for example.

The sensor 1-3 comprises a visible pressure component 13, which in this example assumes the form of a push-button mounted on the pillar 6 in order to be accessible to a user from outside the vehicle. This pressure component 13 is movably mounted relative to the pillar 6 and to the printed circuit 10 in order to be able to be moved, for example, by a few tens or hundreds of micrometers relative to the inductive coil 11 when it is pressed by a user. Advantageously, the pressure component 13 can comprise a logo or a drawing, in particular, which the user can press in order to unlock the door 3. In another embodiment, the pressure component 13 can be in any other suitable form allowing movement, for example, a simple button.

The pressure component 13 is at least partially metal, i.e. it is either fully metal, or it comprises one or more metal parts allowing the electromagnetic field that can be detected by the inductive coil 11 when the pressure component 13 moves to be varied.

In this non-limiting example, the pressure component 13 is at least partially arranged in line with said inductive coil 11, so as to significantly vary the electromagnetic field perceived by the inductive coil 11 and therefore the voltage at the terminals of the inductive coil 11 when a user exerts a pressure on said pressure component.

The management module 12 is electrically connected to the inductive coil 11 in order to continuously receive the value of the voltage defined at the terminals of the inductive coil 11. The management module 12 is able to control the unlocking of the door 3 as soon as the value of the voltage defined at the terminals of the inductive coil 11 varies following a variation in the electromagnetic field received by the inductive coil 11, which itself follows a movement of the pressure component 13 by a user.

The sensor 1-3 can also comprise an interface module (not shown) connected to an electrical source of the vehicle and able to supply the inductive coil 11 and the management module 12 with electrical power.

Figure 7:
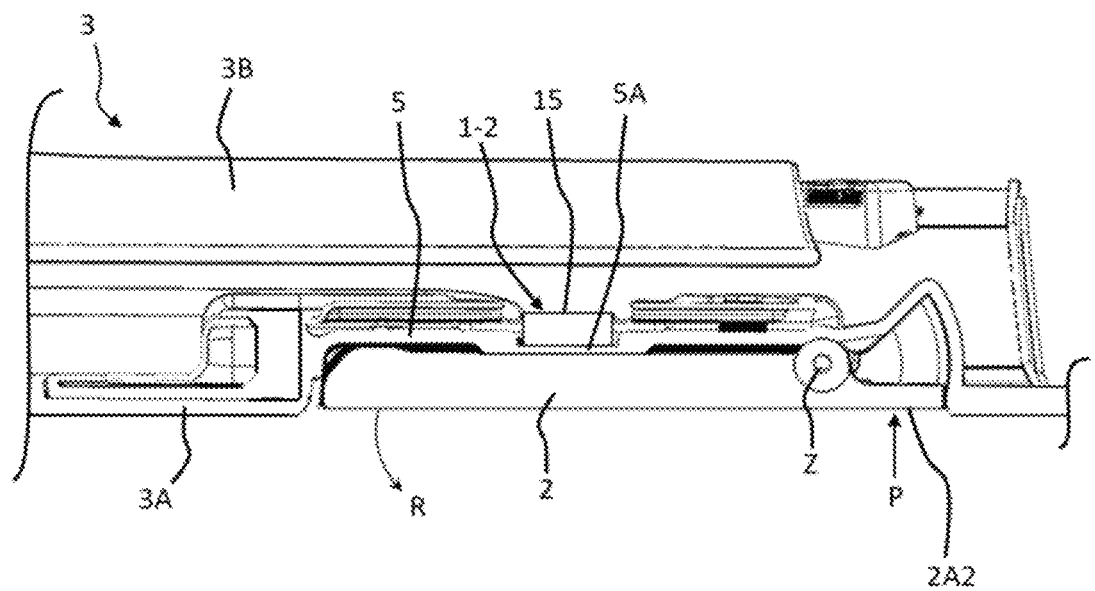
FIG. 7 is a transverse section view of the sensor of FIGS. 3 and 4.

FIG. 7 shows a transverse section view of the sensor 1-2 of FIGS. 3 and 4. In this example, when the user wishes to unlock the door 3, they press P on the zone located at the end 2A2 of the handle 2 in order to pivot the handle about the hinge Z in the direction R. In doing so, with the handle 2 being at least partially metal, for example, chrome, its movement will vary the electromagnetic field perceived by the inductive coil of the sensor 1-2, such that the management module detects a variation in the voltage at the terminals of the inductive coil. When this variation characterizes a movement of the handle 2, the management module controls the unlocking of the door 3, for example, via a control computer of the vehicle (not shown) in a manner per se known.

In the various embodiments described above, the sensor can comprise a casing, in which the pressure component forms a wall of said casing. Similarly, in the various embodiments described above, the visible pressure component can be at least partially made of chrome or of any other metal allowing the electromagnetic field at the terminals of the inductive coil to be varied. The sensor has been described above to allow a door 3 to be unlocked, but could be used for any other function (locking, welcoming, etc.) or at any other point of the vehicle (rear trunk, roof, etc.).

The sensor according to the invention therefore advantageously allows the management module to detect the movement of the pressure component, with said component acting as a metal target for the inductive coil. The sensor according to the invention particularly allows the use of parts such as a dedicated metal target and the corresponding target support to be dispensed with, which makes the sensor less expensive and easier to manufacture and to assemble.

The invention claimed is:

1. An inductive detection sensor for unlocking a vehicle opening, said sensor being configured to be mounted in said vehicle opening, the sensor comprising:
   a printed circuit, on which an inductive coil and a management module are mounted, the management module being configured to detect a variation in the electromagnetic field at the terminals of said inductive coil; and
   a visible pressure component that is a fully metal and non-magnetic push-button or handle at least partially disposed in line with said inductive coil and configured to move relative to the inductive coil after a pressure is directly exerted onto said pressure component, the visible pressure component configured to extend outside of a hollow body defining an internal housing, an outward-facing surface of the visible pressure component being opposite the internal housing of the hollow body, the outward-facing surface of the visible pressure component being visible during use, the management module being configured to control the unlocking of the opening following the detection of a variation in the electromagnetic field at the terminals of the inductive coil following a movement of the visible pressure component.

2. The sensor as claimed in claim 1, wherein the opening is a door comprising a handle,
   wherein the handle comprises the hollow body defining the internal housing, the printed circuit and the inductive coil being configured to be mounted inside said internal housing, and
   the pressure component is a visible element of the handle, outside the internal housing.

3. The sensor as claimed in claim 1, wherein the opening is a door comprising a handle mounted in the internal housing, said housing being closed by a shell,
   the printed circuit and the coil are mounted in a casing fixed on said shell at an opening formed in said shell, and
   the pressure component is a visible element of the handle.

4. The sensor as claimed in claim 1, wherein the opening is a door comprising a pillar,
   the printed circuit and the coil are configured to be mounted in said pillar, and
   the pressure component is an element of said pillar.

5. The sensor as claimed in claim 1, wherein the visible pressure component comprises a logo or a strip used to identify the zone to be pressed to activate the opening.

6. The sensor as claimed in claim 1, wherein the management module is implemented by a microcontroller.

7. The sensor as claimed in claim 1, further comprising a casing, in which the printed circuit is mounted.

8. The sensor as claimed in claim 7, wherein the pressure component is a wall of the casing.

9. A vehicle comprising:
   a movable body; and
   at least one sensor as claimed in claim 1.

10. The sensor as claimed in claim 2, wherein the visible pressure component comprises a logo or a strip used to identify the zone to be pressed to activate the opening.

11. The sensor as claimed in claim 3, wherein the visible pressure component comprises a logo or a strip used to identify the zone to be pressed to activate the opening.

12. The sensor as claimed in claim 4, wherein the visible pressure component comprises a logo or a strip used to identify the zone to be pressed to activate the opening.

13. The sensor as claimed in claim 2, wherein the management module is implemented by a microcontroller.

14. The sensor as claimed in claim 3, wherein the management module is implemented by a microcontroller.

15. The sensor as claimed in claim 4, wherein the management module is implemented by a microcontroller.

16. The sensor as claimed in claim 5, wherein the management module is implemented by a microcontroller.

17. The sensor as claimed in claim 2, further comprising a casing, in which the printed circuit is mounted.

18. The sensor as claimed in claim 3, further comprising a casing, in which the printed circuit is mounted.

19. The sensor as claimed in claim 4, further comprising a casing, in which the printed circuit is mounted.

20. The sensor as claimed in claim 5, further comprising a casing, in which the printed circuit is mounted.

21. An inductive detection sensor for unlocking a vehicle opening, said sensor being configured to be mounted in said vehicle opening, the sensor comprising:
   a printed circuit, on which an inductive coil and a management module are mounted within an internal housing defined by a hollow body and including a hollow space within the hollow body, the management module being configured to detect a variation in the electromagnetic field at the terminals of said inductive coil; and
   a visible pressure component that is a fully metal and non-magnetic push-button or handle mounted within the hollow body and entirely outside of the hollow space, a gap being defined between the printed circuit and the visible pressure component within the hollow space, the visible pressure component being at least partially disposed in line with said inductive coil and configured to move relative to the inductive coil after a pressure is directly exerted onto said pressure component, the management module being configured to control the unlocking of the opening following the detection of a variation in the electromagnetic field at the terminals of the inductive coil following a movement of the visible pressure component.

* * * * *